(12) United States Patent
Lee

(10) Patent No.: US 7,759,675 B2
(45) Date of Patent: Jul. 20, 2010

(54) ORGANIC ELECTROLUMINESCENT DEVICE

(75) Inventor: Chun Tak Lee, Gumi (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/373,263

(22) Filed: Mar. 13, 2006

(65) Prior Publication Data
US 2006/0284193 A1   Dec. 21, 2006

(30) Foreign Application Priority Data
Jun. 17, 2005   (KR) ................. 10-2005-0052517
Jun. 17, 2005   (KR) ................. 10-2005-0052519

(51) Int. Cl.
*H01L 35/24* (2006.01)

(52) U.S. Cl. .......... 257/40; 257/E51.018; 257/E51.019; 257/E51.2; 257/E51.021; 257/E51.022

(58) Field of Classification Search .............. 257/40, 257/E51.018–E51.022
See application file for complete search history.

(56) References Cited

U.S. PATENT DOCUMENTS

| | | | | |
|---|---|---|---|---|
| 5,162,933 A | * | 11/1992 | Kakuda et al. | 349/46 |
| 5,539,549 A | * | 7/1996 | Kishida et al. | 349/51 |
| 2002/0011976 A1 | * | 1/2002 | Hashimoto | 345/76 |
| 2004/0124423 A1 | * | 7/2004 | Lih et al. | 257/79 |
| 2005/0248012 A1 | * | 11/2005 | Furihata | 257/678 |
| 2006/0081845 A1 | * | 4/2006 | Bae | 257/59 |
| 2006/0231831 A1 | * | 10/2006 | Kim | 257/40 |

* cited by examiner

*Primary Examiner*—Kiesha R Bryant
*Assistant Examiner*—Minchul Yang
(74) *Attorney, Agent, or Firm*—Morgan Lewis & Bockius LLP

(57) ABSTRACT

The present invention relates to a light emitting device, particularly to an organic electroluminescent device, that can prevent corrosion of data lines and scan lines and improve the adhesive strength of a sealant. The organic electroluminescent device includes a substrate, a plurality of anode electrode layers disposed in a first direction on the substrate, a plurality of cathode electrode layers disposed in a second direction different from the first direction on the substrate, luminescent areas formed by the anode electrode layers and the cathode electrode layers, a plurality of data lines electrically communicated with the anode electrode layers, and a plurality of scan lines electrically communicated with the cathode electrode layers. At least one of the data lines and the scan lines includes a transparent electrode layer, and the sub-electrode layer completely encloses the transparent electrode layer.

8 Claims, 3 Drawing Sheets

ORGANIC ELECTROLUMINESCENT DEVICE

BACKGROUND OF THE INVENTION

1. Field of the Invention

The present invention relates to a light emitting device, particularly to an organic electroluminescent device, that can prevent corrosion of data lines and scan lines, and improve the adhesive strength of a sealant.

2. Description of the Related Art

Organic electroluminescence is a phenomenon of making an exciton by recombining an electron and a hole injected into an organic (high or low molecular) thin film through an anode and a cathode, and emitting a light having a predetermined wavelength by energy from the exciton.

An organic electroluminescent device in the art includes anode electrode layers, cathode electrode layers, scan lines, and data lines.

A plurality of pixels are formed on an emitting area crossing over the anode electrode layers and the cathode electrode layers.

The data lines each are connected to the anode electrode layers to receive data signals transmitted from an integrated circuit chip and transmit the received data signals to the anode electrode layers. The scan lines each are connected to the cathode electrode layers to transmit scan signals transmitted from the integrated circuit chip to the cathode electrode layers.

In case a positive voltage and a negative voltage are respectively applied to the anode electrode layer and the cathode electrode layer, a light having a certain wavelength is emitted from the organic layer.

The scan lines and data lines are also located on an area to which a cap for encapsulating the organic electroluminescent device is adhered. Thus, if a sealant that is an adhesive used for adhering the cap is spread on the above cap-adhering area, the sealant is placed on each of the scan lines and data lines.

FIG. 1 is a sectional view illustrating the structure of a scan line in the art.

In FIG. 1, each scan line 4A includes an ITO layer (Indium Tin Oxide layer, 4A-1) formed on a substrate 1 and a sub-electrode layer 4A-2 formed on the ITO layer 4A-1.

To lower resistance of the scan line 4A, the sub-electrode layer 4A-2 consisted of a metal having better conductivity than the ITO, for example Mo, is formed on the ITO layer 4A-1. The sub-electrode layer 4A-2 is connected to the cathode electrode layer.

Thus, in the scan line 4A shown in FIG. 1, galvanic corrosion by moisture occurs at an interface of the ITO layer 4A-1 and the sub-electrode layer 4A-2.

Galvanic corrosion is a phenomenon that a metal is corroded by forming an oxidation-deoxidation reaction through movement of an electron when there is a voltage difference between two metals (or same type of two metals) whose corrosion conditions are locally different.

The galvanic corrosion occurred in the interface of the ITO layer 4A-1 and the sub-electrode layer 4A-2 increases resistance of the scan line 4A to lower transmittance velocity of scan data to a pixel.

Also, the data line is formed in the same structure as the scan line 4A in FIG. 1.

Thus, the galvanic corrosion is occurred in the data line the same manner, and increases resistance of the data line to lower the transmittance velocity of data to the pixel, resulting in serious effect to the light emitting device.

SUMMARY OF THE INVENTION

One object of the present invention is to solve at least one of the above problems and/or disadvantages and to provide at least one advantage described hereinafter.

Another object of the present invention is to provide an organic electroluminescent device that can prevent corrosion of data lines and scan lines and improve the adhesive strength of a sealant.

In accordance with a first embodiment of the present invention, the organic electroluminescent device includes a substrate, a plurality of anode electrode layers disposed in a first direction on the substrate, a plurality of cathode electrode layers disposed in a second direction different from the first direction on the substrate, luminescent areas formed by the anode electrode layers and the cathode electrode layers, a plurality of data lines electrically communicated with the anode electrode layers, and a plurality of scan lines electrically communicated with the cathode electrode layers. At least one of the data lines and the scan lines is formed by a transparent electrode layer and a sub-electrode layer formed on the substrate, wherein the sub-electrode layer completely encloses the transparent electrode layer.

The light emitting device according to a second embodiment of the present invention includes a plurality of pixels formed on crossing areas of anode electrode layers and cathode electrode layers on a substrate, and further includes a plurality of data lines electrically communicated with the anode electrode layers and a plurality of scan lines electrically communicated with the cathode electrode layers. At least one of the data lines and the scan lines is formed by a transparent electrode layer and a sub-electrode layer formed on the substrate, wherein the sub-electrode layer completely encloses the transparent electrode layer.

In short, the organic electroluminescent device of the present invention can maintain normal function of the device by preventing corrosion of the scan lines and data lines.

Also, the organic electroluminescent device of the present invention can uniformly spread the sealant to obtain complete enclosing effect by cap.

BRIEF DESCRIPTION OF THE DRAWINGS

The invention will be described in detail with reference to the following drawings in which same reference numerals are used to refer to same elements wherein.

DESCRIPTION OF EMBODIMENTS

Hereinafter, preferred embodiments of the present invention will be explained in more detail with reference to the accompanying drawings.

Figure 1:
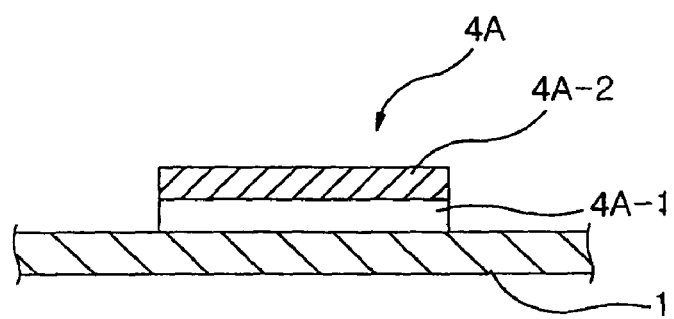
FIG. 1 is a sectional view of the structure of a scan line in the art.
Figure 2:
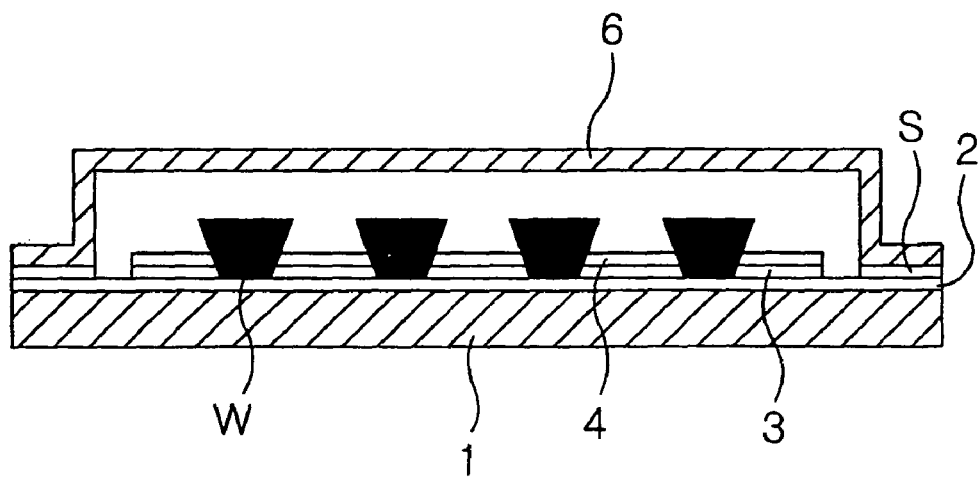
FIG. 2 is a sectional view of the organic electroluminescent device according to one embodiment of the present invention.
Figure 3:
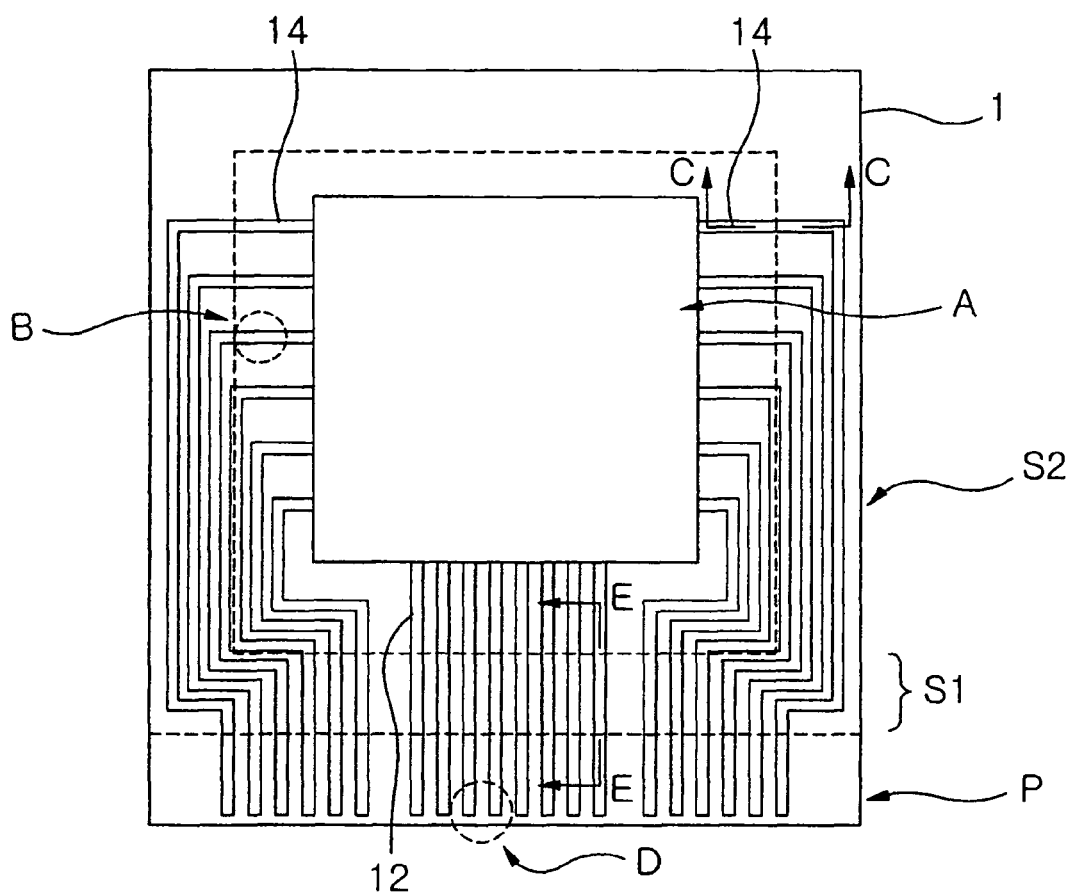
FIG. 3 is a plan view of the organic electroluminescent device of FIG. 2 from which a cap is removed.

FIG. 2 is a sectional view of the organic electroluminescent device according to one embodiment of the present invention. And, FIG. 3 is a plan view of the organic electroluminescent device of FIG. 2 from which a cap is removed. For convenience's sake, FIG. 3 illustrates a view that a cap shown in FIG. 2 is removed.

In FIG. 2, the organic electroluminescent device according to one embodiment of the present invention includes a substrate 1, an anode electrode layer 2, an insulation layer 3, an organic layer 3, a wall W, a cathode electrode layer 4, and a cap 6.

The anode electrode layer 2 is formed with an indium tin oxide (ITO) layer and deposited on the substrate 1.

The organic layer 3 is deposited on the anode electrode layer 2, and includes a hole injection layer (HIL), a hole transporting layer (HTL), an emitting layer (EML), an electron transporting layer (ETL), and an electron injection layer (EIL), in sequence.

The cathode electrode layer 4 may be formed with a metal, for example aluminum (Al), and is deposited on the organic layer 3.

The insulation layer 3 is formed on a part of the upper area of the anode electrode layer 2, and formed with general insulation substance, for example, photoresist.

The wall W is formed to divide the organic layer 3 and the cathode electrode layer 4 into a plurality of sections. That is, the wall W for separating the cathode electrode layer 4 is formed in a space formed between adjacent cathode electrode layers 4, and each wall is separated from the anode electrode layer 3 through the insulation layer 3.

In FIG. 2, a plurality of the data lines 12 and the scan lines 14 each electrically communicated with a plurality of the anode electrode layers 2 and the cathode electrode layers 4 are formed on the outer part of an active area A, and each end of the scan lines 14 and the data lines 12 is concentrated on a part of the substrate 1 to form a pad P.

The scan lines 14 and the data lines 12 are also on the cap-adhered area (S1 and S2 in FIG. 3) to which the cap (6 in FIG. 6) is adhered. Thus, if a sealant S which is an adhesive used for adhering the cap 6 is spread on the cap-adhered area (S1 and S2 in FIG. 3), the sealant S is disposed on each of the scan lines 14 and the data lines 12.

Figure 4:
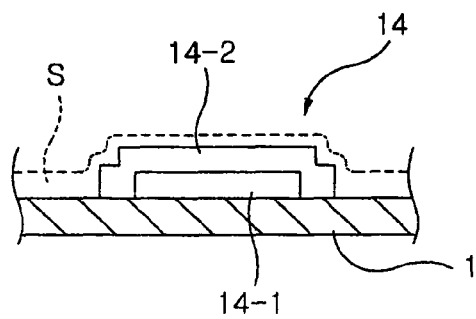
FIG. 4 is a sectional view of the structure of a scan line in part "B" of FIG. 3.

FIG. 4 is a sectional view of the structure of a scan line in part "B" of FIG. 3.

In FIG. 4, each scan line 14 consists of the ITO layer 14-1 formed on the substrate 1 and the sub-electrode layer 14-2 formed on the ITO layer 14-1. Also, the sub-electrode layer 14-2 is formed on the side parts of the ITO layer 14-1 as well as the top part of the scan lines 14 not to expose the ITO layer 14-1.

In forming the scan line 14, at first, the ITO layer 14-1 is formed in the forming area of the scan lines 14 in the process of forming the anode electrode layer 2 in the active area (A in FIG. 3) of the substrate 1, and then the sub-electrode layer 14-2 is formed on the ITO layer 14-1, wherein the sub-electrode layer 14-2 is formed with a metal having low wire resistance, for example, Mo, Ag or Cu. Then, the sub-electrode layer 14-2 is electrically communicated with the cathode electrode layer 4 in the active area A.

In case of applying such structured scan lines 14 to the organic electroluminescent device, the following effect may be obtained.

Each scan line 14 according to the device of the present invention has the structure that the ITO layer 14-1 is not exposed by the sub-electrode layer 14-2, and there is no interface between the sub-electrode layer 14-2 and the ITO layer 14-1. Thus, the galvanic corrosion occurred in the interface of both metals does not occur, either.

Figure 5:
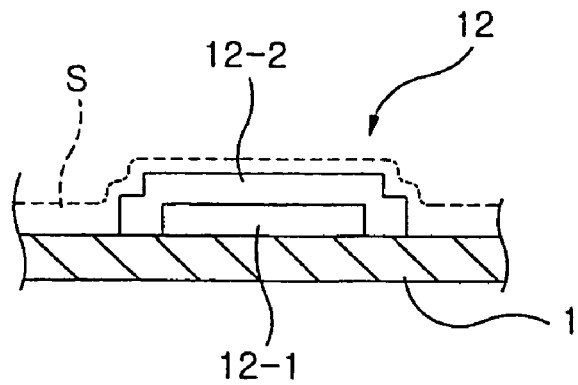
FIG. 5 is a sectional view of the structure of a data line in part "D" of FIG. 3.

FIG. 5 is a sectional view of the structure of a data line in part "D" of FIG. 3.

In FIG. 5, each data line 12 consists of the ITO layer 12-1 formed on the substrate 1 and the sub-electrode layer 12-2 formed on the ITO layer 12-1. Also, the sub-electrode layer 12-2 is formed on the side parts of the ITO layer 12-1 as well as the top part of the data lines 12 not to expose the ITO layer 12-1.

In forming the data line 12, at first, the ITO layer 12-1 is formed in the forming area of the data lines 12 in the process of forming the anode electrode layer (2 in FIG. 2) in the active area (A in FIG. 3) of the substrate 1, and then the sub-electrode layer 12-2 is formed on the ITO layer 12-1, wherein the sub-electrode layer 12-2 is formed with a metal having low wire resistance, for example, Mo, Ag or Cu. Then, the data line 12 is electrically communicated with the anode electrode layer 2 in the active area A.

Each data line 12 according to the device of the present invention has the structure that the ITO layer 12-1 is not exposed by the sub-electrode layer 12-2, and so there is no interface between the sub-electrode layer 12-2 and the ITO layer 12-1. Thus, the galvanic corrosion occurred in the interface of both metals does not occur, either.

Figure 6:
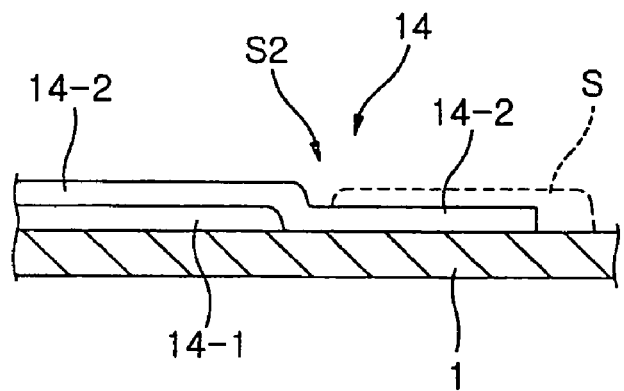
FIG. 6 is a sectional view of the structure of a scan line cut along with line C-C of FIG. 3.

FIG. 6 is a sectional view of the structure of a scan line cut along with line C-C of FIG. 3. In particular, the figure illustrates a part on which the sealant is spread in the scan lines, and a part that is adjacent to the active area.

The sub-electrode layer 14-2 is formed on the ITO layer 14-1 in the structure of the scan line 14 shown in FIG. 4, and so the top part of the sub-electrode layer 14-2 has a height difference on the surface due to thickness of the ITO layer 14-1. The height difference formed on the surface of the sub-electrode layer 14-2 is not a big problem, but is a problem to the scan line 14 formed on the area that on which sealant S is spread, that is, the cap-adhered area (S2 in FIG. 3).

That is, if the sealant S is applied onto the scan line 14 as shown in FIG. 4, that is, onto the sub-electrode layer 14-2, the height difference is also formed on the surface of the sealant S, as shown by a dotted line of FIG. 4. In case the cap 6 is adhered by such spread sealant S as shown above, the adhesive strength of the sealant S is decreased, and so it cannot be expected that the cap 6 is adhered stably and completely. Also, all the elements forming the active area A cannot be perfectly enclosed.

To solve these problems, in the scan line 14 according to the present invention, the part on which the sealant S is spread is formed differently from the part on which the sealant S is not spread.

That is, each scan line 14 consists of the ITO layer 14-1 in lower part and the sub-electrode layer 14-2 in upper part, as shown in FIG. 4. However, the ITO layer 14-1 is not formed in the part corresponding to the area S2 on which the sealant is spread, and only the sub-electrode layer 14-2 is formed on the surface of the substrate 1, as shown in FIG. 6. Here, the structure of the scan line 14 in the part on which the ITO layer 14-1 is formed, that is, the sealant is not spread, is the same as the structure illustrated in FIG. 4.

In the structure of FIG. 6 that the sub-electrode layer 14-2 is directly formed on the surface of the substrate 1 in the area S2 on which the sealant is spread, though the sealant S is spread on the sub-electrode layer 14-2, a sealant layer having a flat surface without forming the height difference is formed. Thus, the cap can be stably adhered and the device can be perfectly enclosed.

Figure 7:
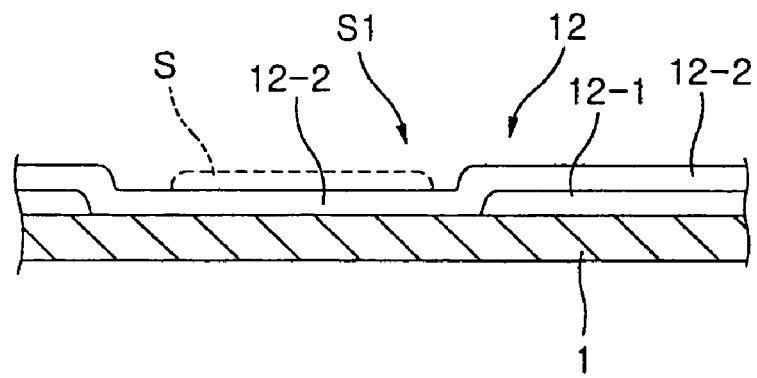
FIG. 7 is a sectional view of the structure of a data line cut along with line E-E of FIG. 3.

FIG. 7 is a sectional view of the structure of a data line cut along with line E-E of FIG. 3. In particular, the figure illustrates a part on which the sealant is spread in the data lines and a part that is adjacent to the active area.

The sub-electrode layer 12-2 is formed on the ITO layer 12-1 in the structure of the data line 12 shown in FIG. 5, and so the sub-electrode layer 12-2 in the upper part has a height difference on the surface due to thickness of the ITO layer 12-1. The height difference formed on the surface of the sub-electrode layer 12-2 is not a big problem, but is a problem to the data line 12 formed on the area (S1 in FIG. 3) on which the sealant S is spread, that is, the cap-adhered area 6.

That is, if the sealant S is applied onto the data line 12 as shown in FIG. 5, that is, the sub-electrode layer 12-2, the height difference is formed on the surface of the sealant S, as shown by a dotted line of FIG. 5. In case the cap 6 is adhered by such spread sealant S as shown above, the adhesive strength of the sealant S is decreased, and so the cap 6 cannot be expected to be adhered stably and perfectly. Also, all the elements forming the active area A cannot be perfectly enclosed.

To solve these problems, in the data line 12 according to the present invention, the part on which the sealant S is spread is formed differently from the part on which the sealant S is not spread.

That is, each data line 12 consists of the ITO layer 12-1 in lower part and the sub-electrode layer 12-2 in upper part, as shown in FIG. 5. However, the ITO layer 12-1 is not formed in the part corresponding to the area S1 on which the sealant is spread, and only the sub-electrode layer 12-2 is formed on the surface of the substrate 1, as shown in FIG. 7. Here, the structure of the data line 14 in the part on which the ITO layer 12-1 is formed, that is, the sealant is not spread, is the same as the structure illustrated in FIG. 5.

In the structure of FIG. 7 that the sub-electrode layer 12-2 is directly formed on the surface of the substrate 1 in the area S1 on which the sealant is spread, though the sealant S is spread on the sub-electrode layer 12-2, a sealant layer S having a flat surface without forming the height difference is formed. Thus, the cap 6 can be stably adhered and the device can be perfectly enclosed.

From the preferred embodiments for the present invention, it is noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. An organic electroluminescent device comprising:
    a substrate:
    a plurality of anode electrode layers disposed in a first direction on the substrate;
    a plurality of cathode electrode layers disposed in a second direction different from the first direction on the substrate;
    luminescent areas formed by the anode electrode layers and the cathode electrode layers;
    a plurality of data lines electrically communicated with the anode electrode layers;
    a plurality of scan lines electrically communicated with the cathode electrode layers; and
    a cap attached to the substrate by a sealant to seal the anode electrode layers, the cathode electrode layers and the luminescent areas,
    wherein each of the data lines and the scan lines includes a transparent electrode layer and a sub-electrode layers formed on the substrate,
    wherein the sub-electrode layer completely encloses the transparent electrode layer, is directly formed on the substrate at an area to which the cap is attached, and
    wherein the sealant is spread on a part of the sub-electrode layers corresponding to the area to which the cap is attached.

2. The device of claim 1, wherein the sub-electrode layer is electrically communicated with the cathode electrode layer.

3. The device of claim 1, wherein the transparent electrode layer includes ITO or IZO.

4. The device of claim 1, wherein the sub-electrode layers include at least one selected from a group consisting of silver and copper.

5. A light emitting device having a plurality of pixels formed on crossing areas of anode electrode layers and cathode electrode layers on a substrate comprising:
    a plurality of data lines electrically communicated with the anode electrode layers;
    a plurality of scan lines electrically communicated with the cathode electrode layers; and
    a cap attached to the substrate by a sealant to seal the anode electrode layers and the cathode electrode layers,
    wherein each of the plurality of data lines includes a transparent electrode layer formed on the substrate and a sub-electrode layer completely enclosing the transparent electrode layer,
    wherein each of the plurality of scan lines includes a transparent electrode layer formed on the substrate and a sub-electrode layer completely enclosing the transparent electrode layer,
    wherein the sub-electrode layers of the data and scan lines are directly formed on the substrate at an area to which the is attached, and
    wherein the sealant is spread on a part of the sub-electrode layers corresponding to the area to which the cap is attached.

6. The device of claim 5, wherein the device is and organic electroluminescence device.

7. The device of claim 5, wherein the transparent electrode layer includes ITO or IZO.

8. The device of claim 5, wherein the sub-electrode layers include at least one selected from a group consisting of silver and copper.

* * * * *